United States Patent
Wu et al.

(10) Patent No.: US 12,482,716 B2
(45) Date of Patent: Nov. 25, 2025

(54) POWER MODULE, PREPARATION MOLD, AND DEVICE

(71) Applicant: HUAWEI TECHNOLOGIES CO., LTD., Guangdong (CN)

(72) Inventors: Fankun Wu, Shanghai (CN); Yunfei Qiao, Shanghai (CN); Junhe Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 527 days.

(21) Appl. No.: 18/159,754

(22) Filed: Jan. 26, 2023

(65) Prior Publication Data
US 2023/0170269 A1 Jun. 1, 2023

Related U.S. Application Data

(63) Continuation of application No. PCT/CN2020/105291, filed on Jul. 28, 2020.

(51) Int. Cl.
*H01L 23/00* (2006.01)
*H01L 21/56* (2006.01)
(Continued)

(52) U.S. Cl.
CPC ........ *H01L 23/3121* (2013.01); *H01L 21/565* (2013.01); *H01L 23/293* (2013.01);
(Continued)

(58) Field of Classification Search
CPC . H01L 23/3121; H01L 21/565; H01L 23/293; H01L 23/49811; H01L 24/32;
(Continued)

(56) References Cited

U.S. PATENT DOCUMENTS 9,630,352 B2   4/2017 Fernandez et al.
2008/0315385 A1  12/2008 Gerber et al.
(Continued)

FOREIGN PATENT DOCUMENTS

CN   103824821 A   5/2014
CN   108321134 A   7/2018
(Continued)

OTHER PUBLICATIONS

Extended European Search Report issued in EP20947337.0, dated Aug. 10, 2023, 10 pages.
(Continued)

*Primary Examiner* — Elias Ullah

(57) ABSTRACT

A power module is provided. The power module includes a substrate, and the substrate is used to carry components and pins of the power module. A circuit layer is disposed on the substrate, to complete an electrical connection between the carried components. The components and the pins are disposed on a same surface of the substrate, and the components and the pins are electrically connected by using the substrate. The power module further includes a sealing layer. The sealing layer is sleeved on the pins, the pins are partially exposed on a surface that is of the sealing layer and that faces away from a plastic packaging layer, and a space for accommodating the plastic packaging layer is formed between the sealing layer and the substrate.

13 Claims, 6 Drawing Sheets

(51) Int. Cl.
  *H01L 23/29* (2006.01)
  *H01L 23/31* (2006.01)
  *H01L 23/498* (2006.01)
(52) U.S. Cl.
  CPC ........ *H01L 23/49811* (2013.01); *H01L 24/32* (2013.01); *H01L 24/48* (2013.01); *H01L 24/73* (2013.01); *H01L 2224/32225* (2013.01); *H01L 2224/48225* (2013.01); *H01L 2224/73265* (2013.01)
(58) Field of Classification Search
  CPC ............ H01L 24/48; H01L 24/73; H01L 2224/32225; H01L 2224/48225; H01L 2224/73265; H01L 21/50; H01L 23/16; H01L 25/072; H01L 23/24; H01L 23/053
  See application file for complete search history.

(56) References Cited

U.S. PATENT DOCUMENTS

| | | |
|---|---|---|
| 2013/0240909 A1 | 9/2013 | Hiramatsu et al. |
| 2018/0082980 A1 | 3/2018 | Liang et al. |
| 2018/0114735 A1 | 4/2018 | Nakamura et al. |

FOREIGN PATENT DOCUMENTS

| | | |
|---|---|---|
| CN | 109273370 A | 1/2019 |
| CN | 109727947 A | 5/2019 |
| CN | 109920785 A | 6/2019 |
| CN | 209409169 U | 9/2019 |
| CN | 110466114 A | 11/2019 |
| CN | 110676237 A | 1/2020 |
| CN | 210272318 U | 4/2020 |
| CN | 210443553 U | 5/2020 |
| EP | 3327755 A1 | 5/2018 |
| JP | 2004207290 A | 7/2004 |
| JP | 2008053509 A | 3/2008 |
| JP | 2009059812 A | 3/2009 |
| JP | 2010182879 A | 8/2010 |
| JP | 2014146774 A | 8/2014 |
| WO | 2020103406 A1 | 5/2020 |
| WO | 2020129195 A1 | 6/2020 |

OTHER PUBLICATIONS

Office Action issued in JP2023-505819, dated Mar. 19, 2024 with English translation, 12 pages.
International Search Report and Written Opinion issued in PCT/CN2020/105291, dated Apr. 25, 2021, 10 pages.

POWER MODULE, PREPARATION MOLD, AND DEVICE

CROSS-REFERENCE TO RELATED APPLICATIONS

This application is a continuation of International Application No. PCT/CN2020/105291, filed on Jul. 28, 2020, the disclosure of which is hereby incorporated by reference in its entirety.

TECHNICAL FIELD

The present disclosure relates to the field of electronic technologies, and in particular, to a power module, a preparation mold, and a device.

BACKGROUND

A power module is a module formed through potting after power devices are combined based on a specific function. The power module is widely applied to a field such as a servo motor, a frequency converter, or an inverter. A top pin is a common structure in the power module, and may facilitate quick crimping or welding of a system end. An existing packaging form of a high power module with a top pin is mainly packaging in which a housing is first bonded and then injection molding is performed. After a copper-clad ceramic substrate, a chip, and the pin are assembled and welded, silicone gel is injected to protect the components. As shown in FIG. 1, in a conventional technology, a power module that uses packaging in which a housing is first bonded and then injection molding is performed is used. The power module includes a substrate 1, and a chip 2 and a pin 3 that are disposed on the substrate 1. The chip 2 is electrically connected to the substrate 1 by using a bonding wire. The pin 3 is electrically connected to the substrate 1 by using a pad. The power module further includes a packaging layer 5, and the packaging layer 5 wraps the chip 2 and a part of the pin 3. The power module further includes a housing 4, and the housing 4 covers the packaging layer 5. An end of the pin 3 is exposed after penetrating the housing 4. When the packaging in which a housing is first bonded and then injection molding is performed is used, limited by a material characteristic of silicone gel, reliability performance is relatively poor, especially moisture-proof performance.

SUMMARY

The present disclosure provides a power module, a preparation mold, and a device, to improve performance of the power module.

According to a first aspect, a power module is provided. The power module is applied to a field such as a servo motor, a frequency converter, or an inverter. The power module includes a substrate, and the substrate is used as a bearing structure to carry components and pins of the power module. Certainly, the substrate may further carry another component based on a requirement of the power module. A circuit layer is disposed on the substrate, to complete an electrical connection between the carried components. When disposed, the components and the pins are disposed on a same surface of the substrate, and the components and the pins are electrically connected by using the substrate. The power module further includes a sealing layer disposed at an interval from the substrate, and the substrate and the sealing layer are separated by a filling space. The power module further includes a plastic packaging layer, the filling space between the substrate and the sealing layer is filled with the plastic packaging layer, and the components and the pins are packaged by the plastic packaging layer. The pins penetrate the sealing layer and the plastic packaging layer and are electrically connected to the substrate, and the pins are partially exposed on a surface that is of the sealing layer and that faces away from the plastic packaging layer. When the plastic packaging layer is used to seal the components, the plastic packaging layer is prepared by a thermosetting material. The thermosetting material may be packaged in an injection molding manner. In addition, the thermosetting material has good waterproof and moisture-proof performance, which improves waterproof and moisture-proof effects of the power module, and improves a protection effect of the power module.

In an example embodiment, a boss structure in a one-to-one correspondence with each pin is disposed on the surface that is of the sealing layer and that faces away from the plastic packaging layer, and each pin penetrates a corresponding boss structure. The boss structure increases a contact area with the pin, and reduces adhesive overflow during injection molding of the plastic packaging layer.

In an example embodiment, each pin has a limiting structure, and a surface that is of the sealing layer and that faces the plastic packaging layer is pressed against the limiting structure. A position of the sealing layer is conveniently limited, and a contact area between the sealing layer and the pin is increased.

In an example embodiment, the limiting structure is a stepped structure or a bench-shaped structure. Different structures may be used to form the limiting structure.

In an example embodiment, the plastic packaging layer is partially extended to outside of the sealing layer, and an extension part of the plastic packaging layer wraps at least a side wall of the sealing layer. The plastic packaging layer wraps the side wall of the sealing layer, thereby improving the waterproof and moisture-proof effects of the power module.

In an example embodiment, the extension part of the plastic packaging layer wraps side walls of the substrate and the sealing layer, thereby improving the waterproof and moisture-proof effects of the power module.

In an example embodiment, the plastic packaging layer has an H-shaped cross section, and the plastic packaging layer has two vertical parts exposed outside the substrate, thereby improving safety of the power module.

In an example embodiment, the power module further includes a cover plate. The cover plate covers the sealing layer and is in pressed contact with the sealing layer. After penetrating the cover plate, the pin is exposed on a surface that is of the cover plate and that faces away from the plastic packaging layer, thereby improving safety of the power module.

In an example embodiment, when the sealing layer has the boss structure, an accommodating groove fitting in with the boss structure is disposed on the cover plate, thereby facilitating the cover plate in fitting in with the sealing layer.

In an example embodiment, the boss structure is in an interference fit with the accommodating groove. A sealing effect between the pin and the sealing layer is improved by squeezing the sealing layer by using the cover plate.

In an example embodiment, the boss structure is a circular boss, and a corresponding accommodating groove is a circular groove, thereby facilitating the sealing layer in fitting in with the cover plate.

In an example embodiment, the plastic packaging layer wraps a side wall of the cover plate, thereby further improving the safety of the power module.

In an example embodiment, the plastic packaging layer is prepared by an EMC plastic packaging material, thereby having good waterproof and moisture-proof effects.

In an example embodiment, the EMC plastic packaging material may be different materials such as bisphenol A epoxy resin or polyol epoxy resin. The plastic packaging layer may be prepared by different materials.

According to a second aspect, a preparation mold is provided. The preparation mold is configured to prepare the power module according to any one of the foregoing. The preparation mold includes an upper mold and a covered lower mold. The upper mold includes a holder and an upper mold core connected to the holder in a detachable manner.

An avoidance hole for avoiding a pin is disposed on the upper mold core. When the upper mold covers the lower mold, the upper mold core is in pressed contact with the lower mold, and a space to be filled with a thermosetting material is formed through enclosure. By using a detachable fit between the upper mold core and the holder, the upper mold core may be replaced with different upper mold cores based on a power module on which injection molding needs to be performed, thereby facilitating preparation of the power module.

In an example embodiment, when the power module includes a cover plate, a locating column is disposed on the upper mold core, and a locating slot fitting in with the locating column is disposed on the cover plate, thereby improving alignment during the preparation.

In an example embodiment, the upper mold core may be connected to the holder in a detachable manner by using a threaded connector. The threaded connector includes, but is not limited to, a screw, a bolt, or a bolt assembly.

According to a third aspect, a device is provided. The device includes a power supply module and the power module according to any one of the foregoing that is connected to the power supply module. A plastic packaging layer is used to wrap a pin, so that waterproof and moisture-proof effects of the power module are improved, and a protection effect of the power module and performance of the power module are improved.

DESCRIPTION OF EMBODIMENTS

First, an example power module is described. The power module is a module formed through potting after power devices are combined based on a specific function. The power module is widely applied to a field such as a servo motor, a frequency converter, or an inverter. The power module may include different components such as various active or passive components, chips, isolated components, or component packages (packaged chips), and the foregoing components are combined based on a required function to form a module with a specific function. When the power module is applied to a product such as a servo motor, a frequency converter, or an inverter, a working environment is relatively poor, and the power module faces adverse factors such as high humidity, a high temperature difference, and high dustiness. To enable the power module to reliably work, the components in the power module need to be packaged, to ensure reliable working of the power module. However, the power module in a conventional technology usually uses a housing package, but limited by a material of silicone gel, the power module has relatively poor waterproof and moisture-proof performance. Therefore, embodiments of the present disclosure provide a power module that improves moisture-proof performance. The following describes the power module in detail with reference to specific accompanying drawings and embodiments.

Figure 1:
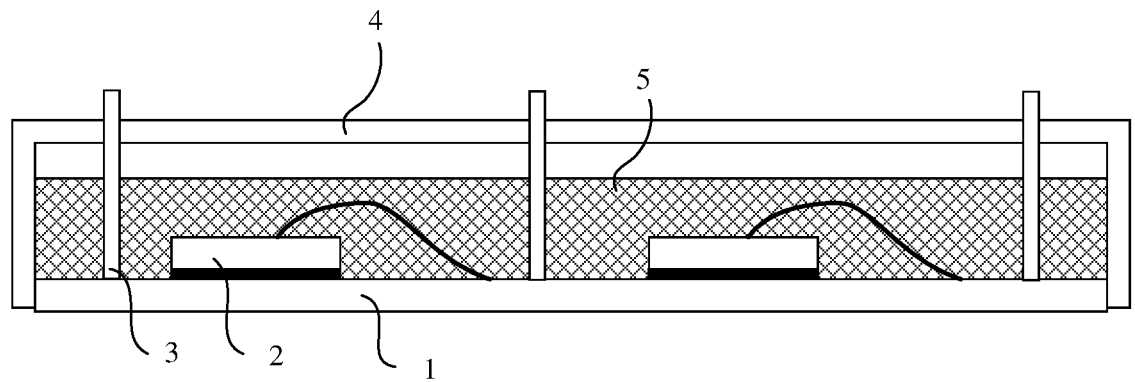
FIG. 1 is a schematic diagram of a structure of an example power module in a conventional technology.
Figure 2:
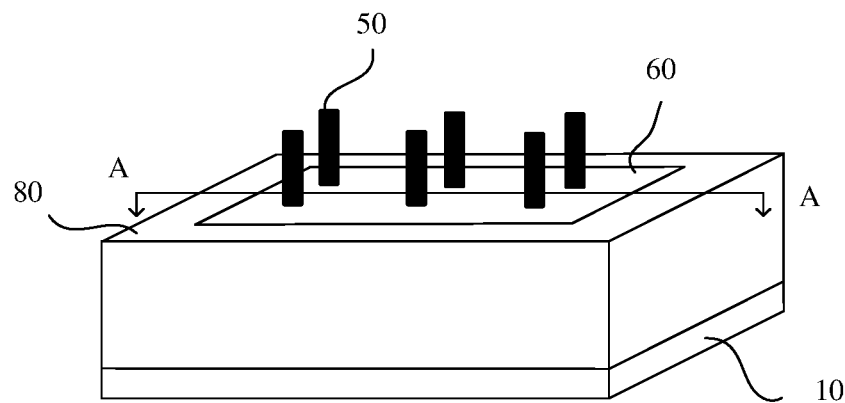
FIG. 2 is a diagram of a structure of an example power module according to an embodiment of the present disclosure.

FIG. 2 shows a schematic diagram of a structure of an example power module according to an embodiment of the present disclosure. The power module provided in this embodiment includes a substrate 10, a plastic packaging layer 80, a sealing layer 60, and pins 50. The substrate 10 is used as a bearing structure to carry components 30 and the pins 50. In addition, the substrate 10 may further electrically connect the components 30 to form a circuit required by the power module. The plastic packaging layer 80 is configured to package the components 30 and the pins 50, to improve waterproof and moisture-proof performance of the power module. The sealing layer 60 is configured to seal the pins 50, to facilitate injection molding of a plastic packaging material. The following describes in detail a structure and a function of each component of the power module with reference to the accompanying drawings.

Figure 3:
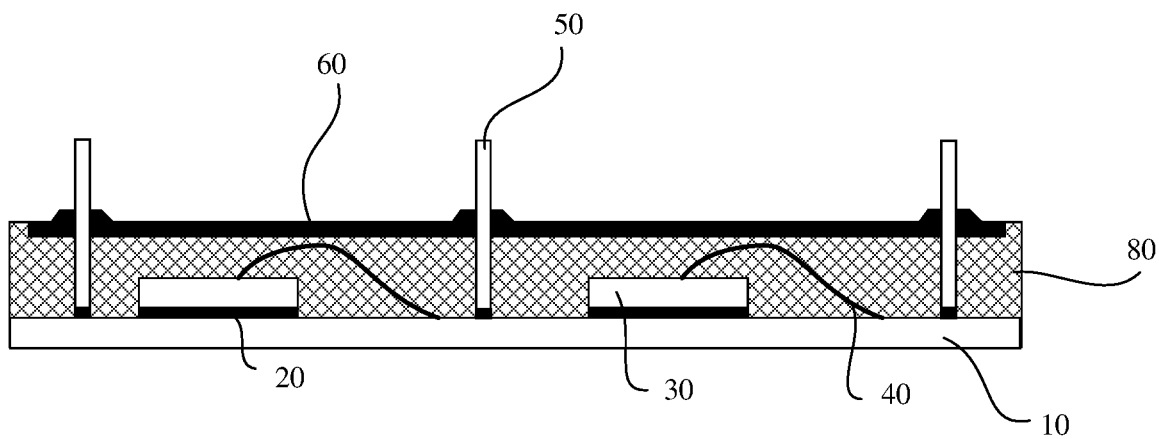
FIG. 3 is a cutaway diagram at A-A in FIG. 2.

FIG. 3 shows a cutaway diagram at A-A in FIG. 2. First, the substrate 10 is described. A surface of the substrate 10 may be used as a bearing surface for carrying the components 30. One surface of the substrate 10 may be used as the bearing surface, or two opposite surfaces of the substrate 10 may be used as the bearing surface. For example, FIG. 2 shows that one surface of the substrate 10 is used as the bearing surface, and the components 30 and the pins 50 are disposed on the same bearing surface of the substrate 10.

The substrate 10 has a circuit layer (not shown in FIG. 3). The circuit layer includes a metal line layer disposed on a surface of the substrate 10 or within the substrate 10 and a plurality of pads 20 electrically connected to the metal line layer. The plurality of pads 20 are located on the bearing surface of the substrate 10, and are configured to connect to the components 30 and the pins 50 carried by the substrate 10. The plurality of pads 20 may be divided into a first pad and a second pad based on a function. A pad 20 connected to the pin 50 is the first pad, and a pad 20 connected to the component 30 is the second pad. When the components 30 and the pins 50 are disposed on the bearing surface, on one hand, the pins 50 and the components 30 are fixed on the bearing surface by respectively using corresponding pads 20, and on the other hand, the pins 50 and the components 30 are electrically connected to the circuit layer of the substrate 10 by respectively using the corresponding pads 20.

In an optional solution, the component 30 may alternatively be connected to the circuit layer of the substrate 10 by using a bonding wire 40. As shown in FIG. 3, one end of the bonding wire 40 is electrically connected to a surface that is of the component 30 and that faces away from the substrate 10, and the other end of the bonding wire 40 is connected to a pad 20 on the substrate 10. The component 30 may be electrically connected to the circuit layer by using the bonding wire 40 and the second pad. It should be understood that FIG. 3 only shows an example in which the component 30 is connected to the circuit layer of the substrate 10 by using one bonding wire 40. However, in this embodiment, a quantity of bonding wires 40 is not specifically limited. Based on a function of the component 30, a different quantity of bonding wires 40 may be selected for the component 30 to connect to the circuit layer of the substrate 10.

Different types of substrates may be used as the substrate 10, such as a printed circuit board or a circuit board on which a circuit is laid.

In this embodiment, a shape of the substrate 10 is not limited. For the power module provided in this embodiment, the substrate 10 may be designed into a shape such as a rectangle, an ellipse, a square, a circle, or an abnormal shape based on a requirement.

Based on a function of the power module, different components may be selected as the component 30 provided in this embodiment. For example, the component 30 may be different components such as various active components, passive components, chips, isolated components, or component packages (packaged chips). It should be understood that, although two components 30 are illustrated in FIG. 3, the component 30 provided in this embodiment is not limited to a quantity of components shown in FIG. 3. FIG. 3 is merely used to illustrate a connection manner between the component 30 and the substrate 10, and does not represent an actual quantity of components 30. Based on the function of the power module, different quantities of components 30, such as one, two, three, or four components 30, may be selected for the power module provided in this embodiment.

The pin 50 provided in this embodiment is connected to the circuit layer of the substrate 10 by using the first pad, and is electrically connected to the component 30 by using the circuit layer of the substrate 10. The pin 50 is used as an external port of the power module, and is configured to connect to another module fitting in with the power module. As shown in FIG. 3, a height direction of the pin 50 is perpendicular to the bearing surface of the substrate 10, and the pin 50 may be extended to outside of the power module. It should be understood that, although three pins 50 are illustrated in FIG. 3, the pin 50 provided in this embodiment is not limited to a quantity of pins shown in FIG. 3. FIG. 3 is merely used to illustrate a connection manner between the pin 50 and the substrate 10, and does not represent an actual quantity of pins 50. Based on the function of the power module, different quantities of pins 50, such as one, two, three, or four pins 50, may be selected for the power module provided in this embodiment.

In an optional solution, the pin 50 may be a pin prepared by a conductive metal material such as copper, aluminum, or alloy. When the pin 50 is prepared by the foregoing material, on one hand, the pin 50 has good electrical conductivity, and on the other hand, the pin 50 may further have good elasticity and rigidity, to ensure that the power module is connected to a fitted module.

In the height direction of the pin 50, the pin 50 may be divided into a packaging area and a connecting area. The packaging area is an area in which the pin 50 is packaged by the plastic packaging layer 80 and the sealing layer 60. The connecting area is an area in which the pin 50 is exposed to outside of the sealing layer 60 and that faces away from the plastic packaging layer 80. The connecting area is used to connect the power module to the fitted module. It should be understood that the packaging area and the connecting area are areas divided based on a function of the pin 50. This does not mean that the pin 50 includes two parts. In this embodiment, the pin 50 is integrally prepared by a metal material. The division of the foregoing areas is merely for ease of description.

The plastic packaging layer 80 provided in this embodiment is configured to wrap the component 30 and the pin 50 that are disposed on the substrate 10, to improve performance such as moisture-proof, waterproof, and dust-proof performance of the power module. The plastic packaging layer 80 provided in this embodiment is prepared by a thermosetting material. The thermosetting material is a material that is solidified through heating when the material is in a liquid state. Compared with silicone gel, the thermosetting material has better waterproof and moisture-proof effects. For example, the thermosetting material may be an Epoxy Molding Compound (EMC) material, for example, different materials such as bisphenol A epoxy resin or polyol epoxy resin.

The power module provided in this embodiment further includes the sealing layer 60. The sealing layer 60 is disposed at an interval from the substrate 10, and the substrate 10 and the sealing layer 60 are separated by a filling space. The filling space is used to be filled with the plastic packaging layer 80. When prepared, the plastic packaging layer 80 may fill the filling space between the substrate 10 and the sealing layer 60, and seal the pin 50 and the component 30.

A spacing between the sealing layer 60 and the substrate 10 may be used to limit a thickness of the plastic packaging layer 80, to prevent the plastic packaging layer 80 from packaging the connecting area of the pin 50. When the plastic packaging layer 80 is prepared by the thermosetting material, the substrate 10 with the component 30 and the pin 50 is placed in a mold, and a cavity for injection molding of the plastic packaging layer 80 is formed through enclosure by an upper mold and a lower mold. To ensure that the connecting area of the pin 50 is exposed outside the plastic packaging layer 80, an avoidance hole for avoiding the pin 50 is disposed on the upper mold, and the sealing layer 60 is in pressed contact with the upper mold to plug the avoidance hole of the upper mold, to form a sealed cavity into which the thermosetting material may be injected. After the injection molding is completed, the plastic packaging layer 80 is filled between the substrate 10 and the sealing layer 60, and due to a sealing effect of the sealing layer 60, the thermosetting material is prevented from overflowing into the connecting area of the pin 50.

Further referring to FIG. 3, when the plastic packaging layer 80 is prepared, the plastic packaging layer 80 is partially extended to an outside of the sealing layer 60, and an extension part of the plastic packaging layer 80 wraps a side wall of the sealing layer 60. The plastic packaging layer 80 has a concave cross section, the sealing layer 60 is located in a recessed area in the middle of the plastic packaging layer 80, and the plastic packaging layer 80 wraps the side wall of the sealing layer 60. When the foregoing structure is used, the sealing layer 60 is wrapped by the plastic packaging layer 80, thereby increasing a contact area between the plastic packaging layer 80 and the sealing layer 60. In addition, when the plastic packaging layer 80 is solidified, the sealing layer 60 may be embedded in the plastic packaging layer 80, and connected to the plastic packaging layer 80 in a sealing manner. The sealing layer 60 is also used as a sealing component of the entire power module, and may improve waterproof, moisture-proof, and dust-proof effects of the power module.

Figure 4:
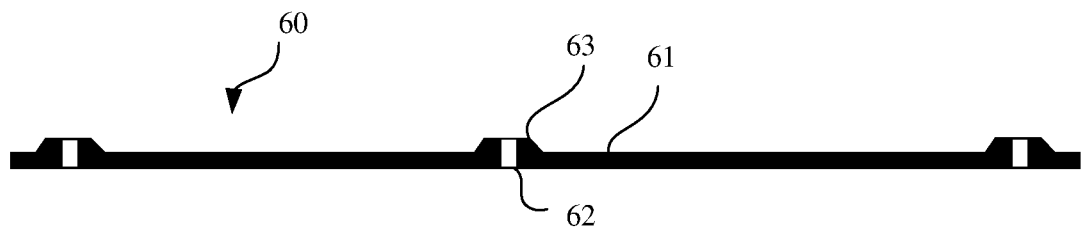
FIG. 4 is a schematic diagram of a structure of an example sealing layer according to an embodiment of the present disclosure.

FIG. 4 shows a schematic diagram of a structure of an example sealing layer 60 according to an embodiment of the present disclosure. The sealing layer 60 includes a main structure 61. The main structure 61 is configured to be provided with a through hole 62 fitting in with each pin. When the sealing layer 60 is sleeved on the pins, the pins are correspondingly inserted into the through holes 62 one by one, and are in sealed contact with side walls of the through holes 62.

In an optional solution, a boss structure 63 in a one-to-one correspondence with each pin is disposed on a surface that is of the sealing layer 60 and that faces away from the plastic packaging layer 80. The boss structure 63 is disposed on a surface that is of the main structure 61 and that faces away from the substrate. Each through hole 62 penetrates the main structure 61 and the boss structure 63. When the pin is inserted into the through hole 62, the boss structure 63 increases a depth of the through hole 62, that is, increases a contact area between the pin and the sealing layer 60, so that a sealing effect between the pin 50 and the sealing layer 60 is improved, and overflow of a plastic packaging material may be prevented during injection molding of the plastic packaging layer 80.

In an optional solution, the sealing layer 60 may be prepared by a material having good sealing performance, such as silica gel or rubber.

In an optional solution, when the sealing layer 60 is connected to the pin in a sealing manner, sealing between the sealing layer 60 and the pin may be implemented by using elasticity performance of the sealing layer 60 and an interference fit between the pin and the through hole 62: or sealing between the sealing layer 60 and the pin may be implemented by bonding the sealing layer 60 to the pin by using sealant.

Figure 5:
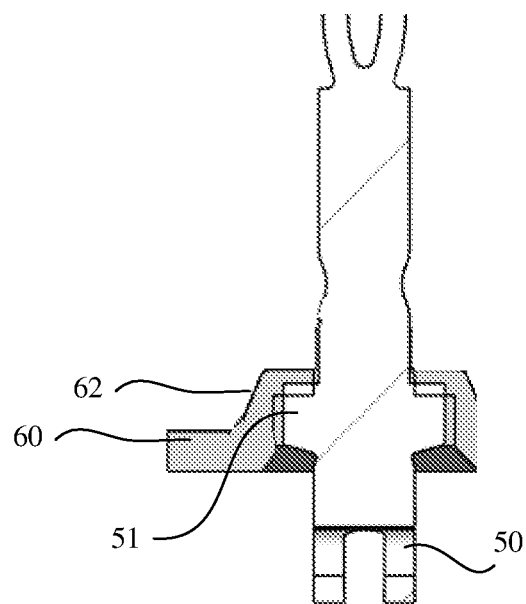
FIG. 5 is a schematic diagram of an example fit between a sealing layer and a pin according to an embodiment of the present disclosure.

FIG. 5 shows a schematic diagram of an example fit between a pin and a sealing layer. Each pin 50 has a limiting structure 51 that limits an insertion depth of the sealing layer 60, and the limiting structure 51 is disposed in the connecting area of the pin 50. When the sealing layer 60 is sleeved on the pin 50, a surface that is of the sealing layer 60 and that faces the plastic packaging layer is pressed against the limiting structure 51, thereby limiting a depth at which the sealing layer 60 is inserted along the pin 50, and further ensuring that the sealing layer 60 is substantially parallel to the substrate 10 after being sleeved on the pin 50, and a regular filling space of the plastic packaging layer 80 is formed through enclosure by the sealing layer 60 and the substrate 10. In addition, pressed contact between the limiting structure 51 and the sealing layer 60 may further increase a contact area between the sealing layer 60 and the pin 50, thereby further improving the sealing effect of the sealing layer 60.

For example, the limiting structure 51 of the pin 50 may be different structures, such as a bench-shaped structure or a stepped structure. When the limiting structure 51 is a stepped structure, the stepped structure may be located outside the sealing layer 60, a stepped surface of the stepped structure is pressed against a surface that is of the sealing layer 60 and that faces the substrate 10, and the through hole in the sealing layer 60 is a through hole having a constant diameter. Alternatively, the limiting structure 51 may be inserted into the sealing layer 60 with a sealing cushion. Specifically, the through hole 62 in the sealing layer 60 with the sealing cushion is a stepped hole, an opening direction of a first hole of the stepped hole faces the substrate, and an opening direction of a second hole of the stepped hole faces away from the substrate. A diameter of the first hole is greater than a diameter of the second hole. During assembly, the stepped surface of the stepped structure is pressed against a stepped surface of the stepped hole. When the limiting structure 51 is a bench-shaped structure, a size of the bench-shaped structure gradually decreases in a direction away from the substrate. The through hole in the sealing layer 60 with the sealing cushion is a fitted bench-shaped hole. When the bench-shaped structure is inserted, a side wall of the bench-shaped structure is in contact with a side wall of the bench-shaped hole, and as the insertion depth of the sealing layer 60 increases, contact pressure between the pin 50 and the sealing layer 60 gradually increases, thereby improving the sealing effect between the sealing layer 60 and the pin 50.

In an optional solution, when the limiting structure 51 is a bench-shaped structure, the limiting structure 51 may be different bench-shaped structures, such as a circular bench-shaped structure, a square bench-shaped structure, or the like.

Figure 6:
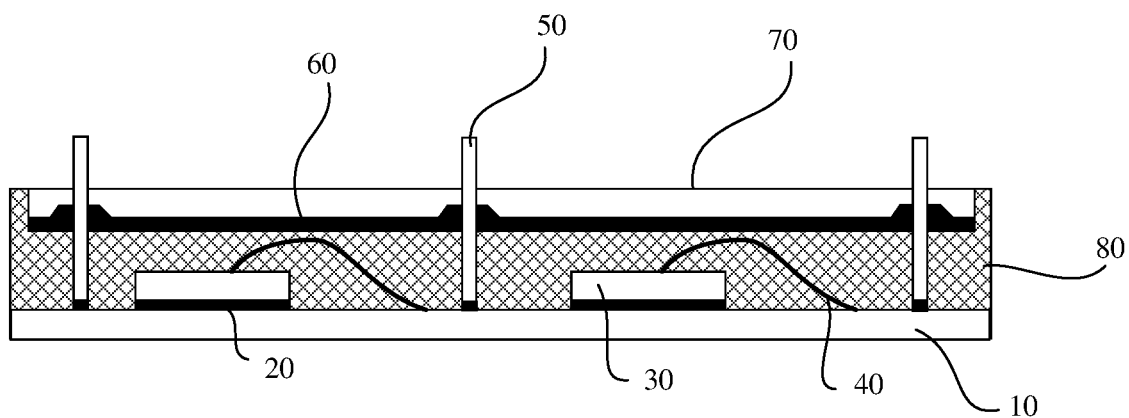
FIG. 6 is a schematic diagram of a structure of another example power module according to an embodiment of the present disclosure.

FIG. 6 shows a schematic cutaway diagram of another example power module according to an embodiment of the present disclosure. For some reference signs in FIG. 6, refer to the same reference signs in FIG. 3. The power module in FIG. 6 includes a cover plate 70, in addition to a substrate 10, a component 30, a pin 50, a plastic packaging layer 80, and a sealing layer 60. The cover plate 70 is sleeved on the pin 50, and is located on a surface that is of the sealing layer 60 and that faces away from the substrate 10. During assembly, the cover plate 70 is in pressed contact with the sealing layer 60. Hardness of the cover plate 70 is greater than hardness of the sealing layer 60, so that the cover plate 70 can protect the sealing layer 60 and prevent the sealing layer 60 from being damaged. In addition, when the plastic packaging layer is prepared, an upper mold may transfer force to the sealing layer 60 by using the cover plate 70, and the cover plate 70 may be used as a support structure for the sealing layer 60.

In an optional solution, the cover plate 70 may be prepared by a material having relatively high hardness, such as plastic or resin. All of the foregoing materials have relatively high hardness.

In an optional solution, when the cover plate 70 is laminated with the sealing layer 60, the cover plate 70 may be bonded and connected to the sealing layer 60 by using an adhesive, thereby improving stability of a connection between the cover plate 70 and the sealing layer 60.

In an optional solution, a part that is of the plastic packaging layer 80 and that is extended to the sealing layer 60 may further wrap the cover plate 70, and be connected and fixed to the cover plate 70, so that waterproof and moisture-proof effects of the power module may be further improved.

Figure 7:
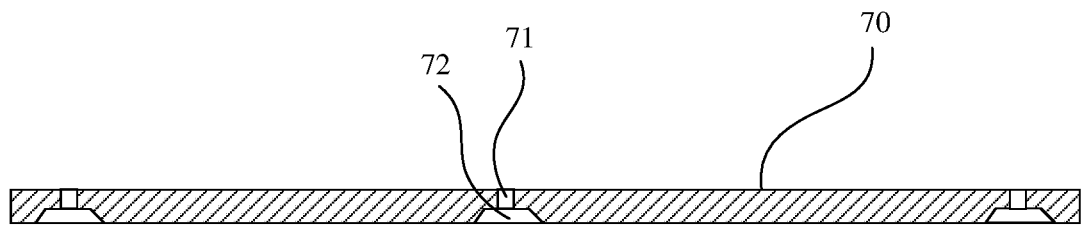
FIG. 7 is a schematic diagram of a structure of an example cover plate according to an embodiment of the present disclosure.

FIG. 7 shows a schematic diagram of a structure of an example cover plate. A plurality of through holes 71 are disposed on the cover plate 70. Disposing positions and a quantity of through holes 71 correspond to disposing positions and a quantity of pins, to ensure that the cover plate 70 may be sleeved on the pins.

In an optional solution, when the sealing layer has a boss structure, an accommodating groove 72 fitting in with the boss structure is disposed on the cover plate 70. During assembly, the cover plate 70 is attached to the sealing layer, and the boss structure of the sealing layer is inserted into the accommodating groove 72 of the cover plate 70. When the boss structure is in a different shape, a shape of the accommodating groove 72 matches the shape of the boss structure, so that the boss structure may be located in the accommodating groove 72. For example, when the boss structure is a circular boss, a corresponding accommodating groove 72 is a circular groove: or when the boss structure is a tapered boss, a corresponding accommodating groove 72 is a tapered groove.

In an optional solution, the boss structure is in an interference fit with the corresponding accommodating groove 72. When the cover plate 70 is assembled, the cover plate 70 may squeeze the boss structure to produce an elastic deformation, thereby increasing contact pressure between the pin and the boss structure, and improving a sealing effect of the sealing layer on the pin.

It should be understood that the accommodating groove 72 is in a one-to-one correspondence with the through hole 71, and the accommodating groove 72 is connected to the through hole 71, to ensure that the cover plate 70 may be assembled to the boss structure and the pin.

Figure 8:
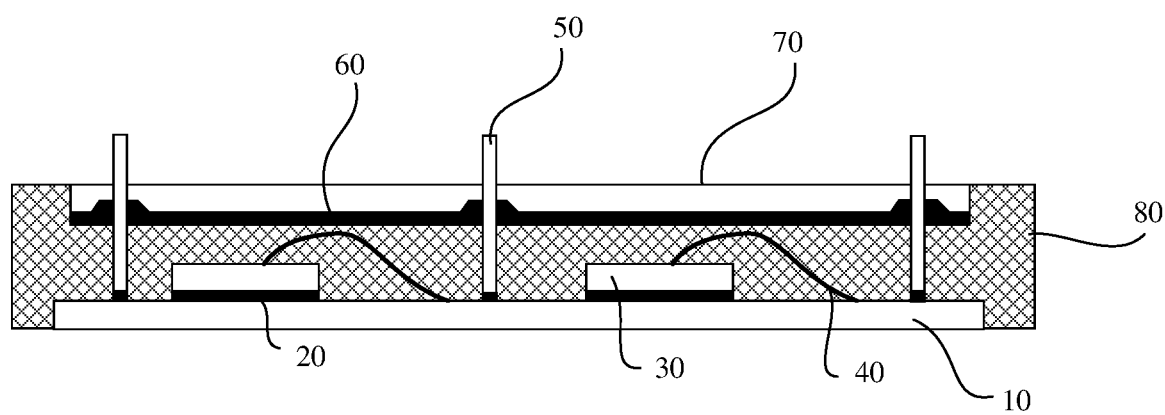
FIG. 8 is a schematic diagram of a structure of another example power module according to an embodiment of the present disclosure.

FIG. 8 shows a schematic cutaway diagram of another example power module according to an embodiment of the present disclosure. For some reference signs in FIG. 8, refer to the same reference signs in FIG. 6. The power module shown in FIG. 8 differs from the power module shown in FIG. 6 in that the plastic packaging layer 80 is different. In the power module shown in FIG. 8, an extension part of the plastic packaging layer 80 wraps side walls of the substrate 10 and the sealing layer 60.

The plastic packaging layer 80 has an H-shaped cross section, which includes a horizontal part and two vertical parts. The horizontal part is located between the sealing layer 60 and the substrate 10, and the two vertical parts are located on outer sides of the substrate 10. It may be understood from the three-dimensional diagram of the power module shown in FIG. 2 that the plastic packaging layer 80 shown in FIG. 8 is located on a periphery of the power module. A frame structure is formed through enclosure by the vertical parts, and the substrate 10, the component 30, the pin 50, the sealing layer 60, and the cover plate 70 are enclosed in the frame structure. Therefore, waterproof and moisture-proof effects of the power module may be improved.

In addition, when the plastic packaging layer 80 uses the structure shown in FIG. 8, the vertical parts may further protect the substrate 10 and increase a dielectric withstanding voltage.

In an optional solution, a width of the vertical part of the plastic packaging layer 80 is not less than 1 mm. For example, the width of the vertical part of the plastic packaging layer 80 may be 2 mm.

To facilitate understanding of the structure of the power module provided in the embodiments of the present disclosure, the following describes a preparation method of the power module with reference to accompanying drawings.

Step 001: Mount solder on a substrate.

Figure 9A:
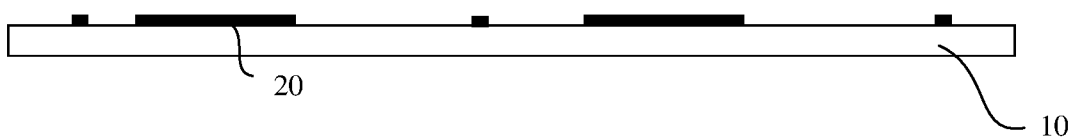
FIG. 9*a* to FIG. 9*g* are an example preparation method of a power module according to an embodiment of the present disclosure.

As shown in FIG. 9*a*, the substrate 10 may be a printed circuit board or another type of substrate. However, regardless of a type of the used substrate, the substrate 10 includes at least one metal line layer. The at least one metal line layer includes a circuit layer configured to electrically connect to a component, and a ground layer. In addition, a plurality of pads 20 are further disposed on the substrate 10, including but not limited to a pad 20 configured to electrically connect to the component and a pad 20 configured to electrically connect to a pin. When the solder is mounted on the substrate 10, the solder is connected to the pads 20 corresponding to the component 30 and the pin 50. Specific solder mounting may specifically include solder paste printing, soldering lug mounting, solder wire mounting, or the like.

Step 002: Solder the component.

Figure 9B:
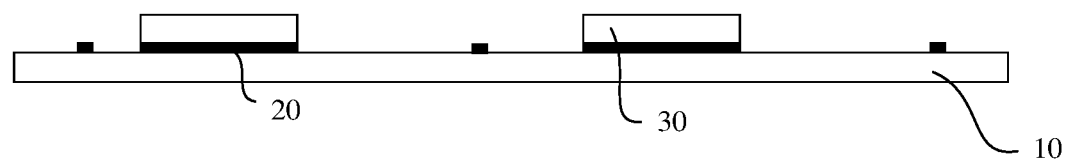

As shown in FIG. 9*b*, the component 30 is fixed to the substrate 10 through LF (Leadframe) soldering. The component 30 includes various active or passive components, chips, isolated components, packaged chips, or resistor-capacitor components such as capacitors.

Step 003: Interconnect the components.

Figure 9C:
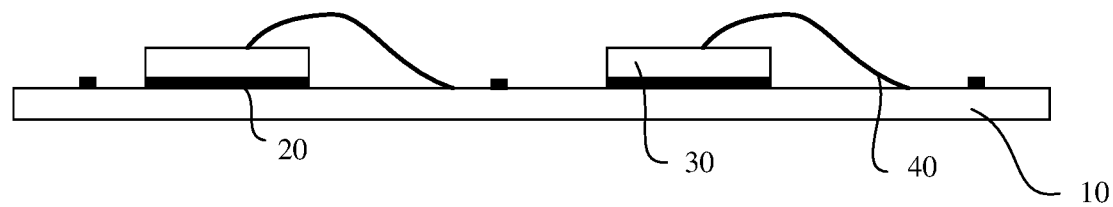

As shown in FIG. 9*c*, the component 30 is connected to the circuit layer of the substrate 10 by using a bonding wire 40. One end of the bonding wire 40 is electrically connected to a surface that is of the component 30 and that faces away from the substrate 10, and the other end of the bonding wire 40 is connected to a pad 20 on the substrate 10. In this way, the component 30 is connected to a circuit, and the component 30 is electrically connected to the circuit layer by using the bonding wire 40.

Step 004: Assemble the pin.

Figure 9D:
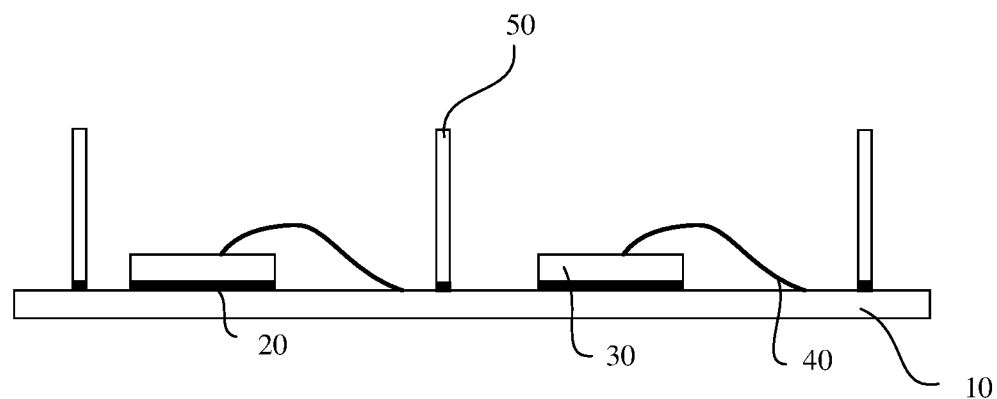

As shown in FIG. 9*d*, solder paste is applied to the pad 20 corresponding to the pin 50, and the pin 50 is fixed to the corresponding pad 20 in a soldering manner. The pin 50 is electrically connected to the circuit layer on the substrate 10 by using the pad 20.

Step 005: Assemble a sealing layer.

Figure 9E:
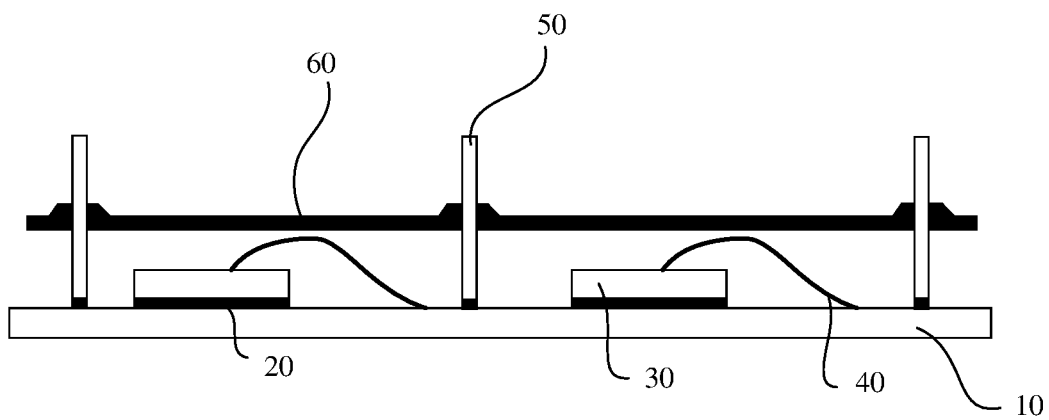

As shown in FIG. 9*e*, the sealing layer 60 is sleeved on the pin 50, and the sealing layer 60 is sealed with the pin 50. For a sealing manner between the sealing layer 60 and the pin 50, refer to the related description in FIG. 4, and details are not described herein. When the sealing layer 60 is sleeved on the pin 50, an insertion depth of the sealing layer 60 may be limited by a limiting structure of the pin 50. In this way, a thickness of a plastic packaging layer 80 is limited by the sealing layer 60, to avoid plastic packaging to a connecting area of the pin 50. For details, refer to the related description in FIG. 5, and details are not described herein.

Step 006: Assemble a cover plate.

Figure 9F:
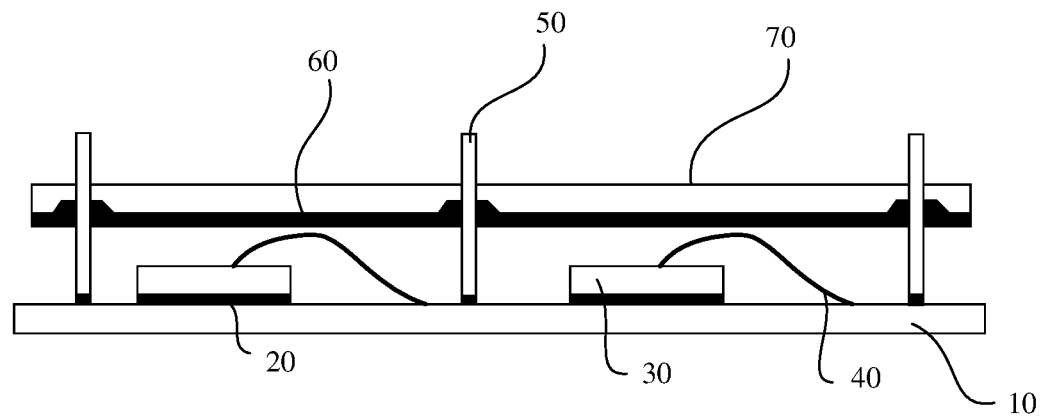

As shown in FIG. 9*f*, the cover plate 70 is sleeved on the pin 50, and the cover plate 70 is laminated with the sealing layer 60. During disposing, a boss structure of the sealing layer 60 is inserted into an accommodating groove of the cover plate 70, to improve a sealing effect between the pin 50 and the sealing layer 60. For details, refer to the related description in FIG. 7, and details are not described herein.

Step 007: Perform plastic packaging on the module.

Figure 9G:
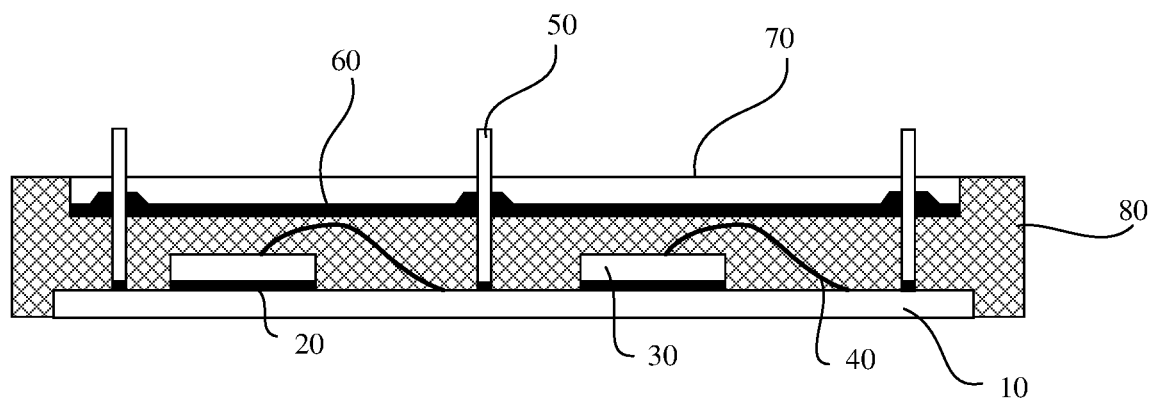

As shown in FIG. 9g, a semi-finished product prepared in FIG. 9f is placed into a mold for injection molding, and a plastic packaging material is solidified into the plastic packaging layer 80 through heating.

An embodiment of the present disclosure further provides a preparation mold. The following describes in detail a plastic packaging process of a power module with reference to the preparation mold.

Figure 10:
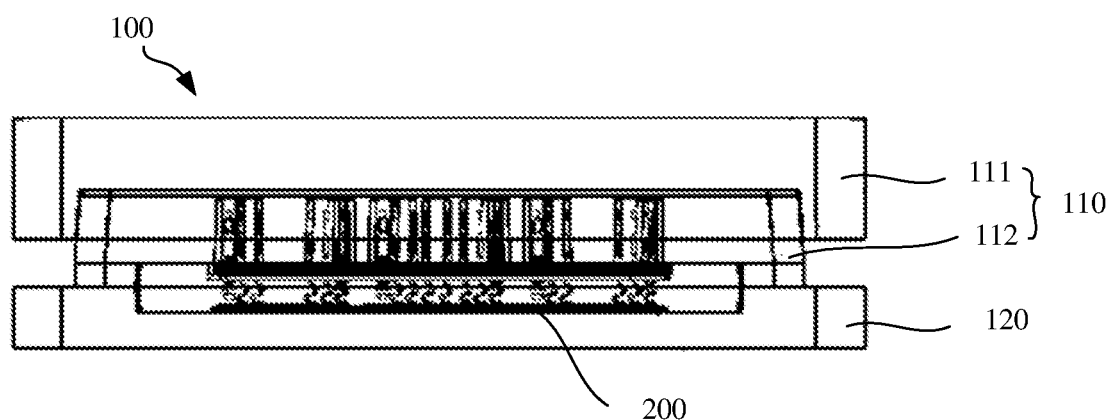
FIG. 10 is an example preparation mold according to an embodiment of the present disclosure.

FIG. 10 shows a schematic diagram of a structure of an example preparation mold according to an embodiment of the present disclosure. The preparation mold 100 provided in this embodiment is configured to produce the foregoing power module. The preparation mold 100 includes an upper mold 110 and a lower mold 120 covered with the upper mold 110. During use, the lower mold 120 may be fixedly disposed on a device or a mold base, and the upper mold 110 may be disposed on the device or the mold base, and may move relative to the lower mold 120. A device that drives the upper mold 110 to move is a common device in an injection molding device, and details are not described herein. When the upper mold 110 is raised to a specific height relative to the lower mold 120, the upper mold 110 is separated from the lower mold 120, and a semi-finished product 200 on which injection molding is to be performed may be placed and fixed in the lower mold 120. Then, the upper mold 110 may be lowered by a specific height to cover the lower mold 120 and form a space for injection molding through enclosure.

Figure 11:
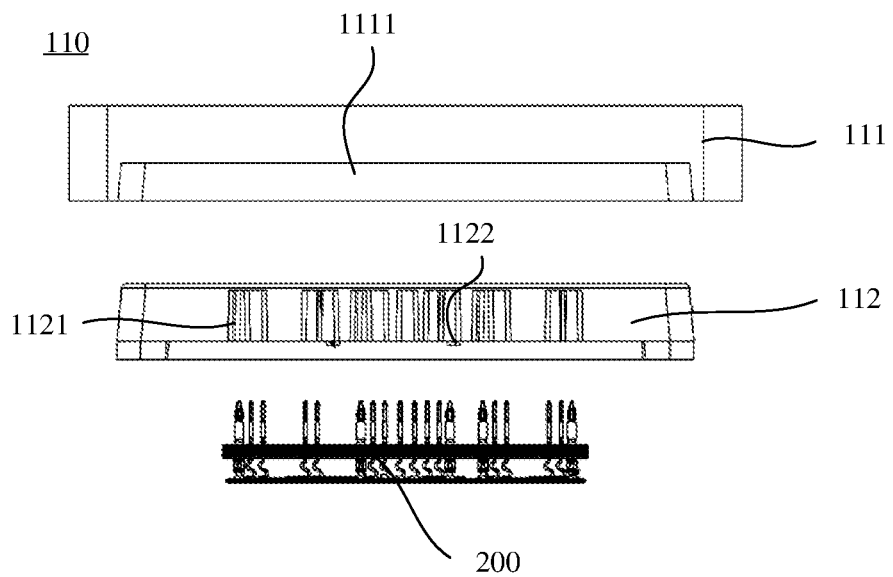
FIG. 11 is a schematic exploded view of an example upper mold according to an embodiment of the present disclosure.

FIG. 11 shows a schematic diagram of a structure of an example upper mold according to an embodiment of the present disclosure. The upper mold 110 provided in this embodiment includes a holder 111 and an upper mold core 112 connected to the holder 111 in a detachable manner. The holder 111 is configured to connect to the device that drives the upper mold 110, and the upper mold core 112 is configured to be pressed against the semi-finished product 200 on which injection molding is to be performed. When the upper mold 110 covers the lower mold 120, the upper mold core 112 is in pressed contact with the lower mold 120, and a space to be filled with a thermosetting material is formed through enclosure.

When the upper mold core 112 is pressed against the semi-finished product 200 on which injection molding is to be performed, the upper mold core 112 may be pressed against a cover plate, and is configured to limit a position of the cover plate, to ensure that a plastic packaging material may be filled between a sealing layer and a substrate during injection molding. When the power module does not have a cover plate, the upper mold core 112 may be pressed against the sealing layer to limit the sealing layer, thereby achieving a same effect.

In an optional solution, a cavity 1111 is disposed in the holder 111, and the cavity 1111 is configured to accommodate the upper mold core 112. For example, the cavity 1111 may be a trapezoidal cavity, and there is a specific included angle between a side wall of the trapezoidal cavity and a vertical direction (a placement direction of the upper mold shown in FIG. 11 is used as a reference direction). The upper mold core 112 also has a matching trapezoidal shape. During assembly, the side wall of the cavity 1111 is clamped on an outer side wall of the upper mold core 112, thereby fixing the upper mold core 112 in the holder 111. Alternatively, the upper mold core 112 may be connected and fixed to the holder 111 in a detachable manner by using a threaded connector (a screw, a bolt, or a bolt assembly).

An avoidance hole 1121 for avoiding a pin is disposed on the upper mold core 112. When the upper mold core 112 is pressed against the cover plate or the sealing layer, the pin may penetrate the avoidance hole 1121, thereby preventing the upper mold core 112 from squeezing the pin. As shown in FIG. 11, the upper mold core 112 has a specific height in the vertical direction, to ensure that a depth of the avoidance hole 1121 is not less than a length of a connecting area of the pin, thereby improving safety of the pin.

In an optional solution, when the upper mold core 112 is pressed against the cover plate, a locating structure is disposed between the upper mold core 112 and the cover plate, to ensure that the upper mold core 112 may be aligned with the cover plate, thereby improving precision during injection molding. In an optional solution, the locating structure may include a locating column 1122 disposed on the upper mold core 112, and a locating slot that is disposed on the cover plate and that fits in with the locating column 1122. Alternatively, the locating structure may include a locating slot disposed on the upper mold core 112, and a locating column that is disposed on the cover plate and that fits in with the locating slot.

Figure 12:
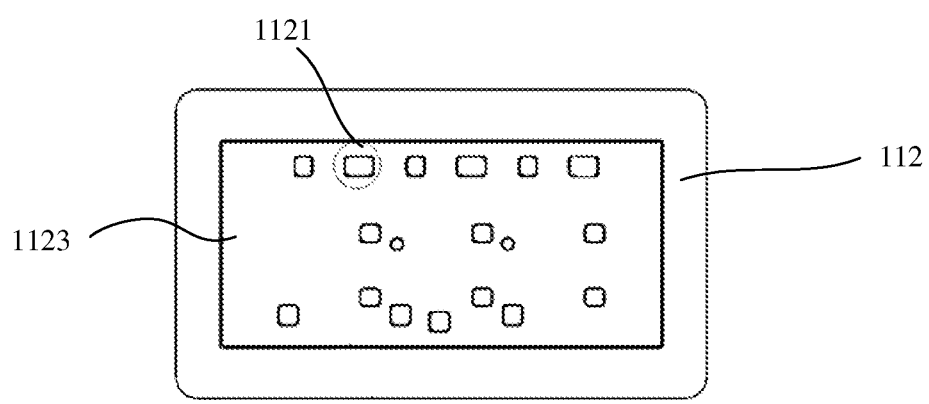
FIG. 12 is a schematic diagram of a structure of an example upper mold core according to an embodiment of the present disclosure.

FIG. 12 shows a bottom view of the upper mold core. A surface (a first surface 1123) that is of the upper mold core 112 and that faces the lower mold should have a large enough contact area with the cover plate or the sealing layer, and all pins may penetrate avoidance holes 1121. In an example, the avoidance hole 1121 is not disposed on a corner of the first surface 1123, to ensure that the first surface 1123 may be pressed against the cover plate or the sealing layer, thereby avoiding warping of an edge of the cover plate or the sealing layer, and ensuring an injection molding effect of the power module.

In an optional solution, the avoidance hole 1121 may be in a one-to-one correspondence with the pin, or the avoidance hole 1121 may correspond to at least two pins. When the avoidance hole 1121 corresponds to at least two pins, two or more pins that are relatively close to each other on the power module may be divided into one group of pins. The avoidance hole 1121 disposed on the first surface 1123 may accommodate one pin or one group of pins, thereby reducing a quantity of disposed avoidance holes 1121 and reducing a requirement on precision of the mold.

When the power module uses different functions, corresponding pin quantities and arrangement manners are also different. Therefore, the preparation mold provided in this embodiment has upper mold cores corresponding to different types of power modules. Each upper mold core has an avoidance hole that matches a pin of a power module corresponding to the upper mold core. During production, when the produced power module needs to be replaced, only the upper mold core needs to be removed from the holder for replacement, and the lower mold and the holder in the upper mold do not need to be replaced, so that different types of power modules may be produced by using a set of devices, and the replacement is convenient.

It may be learned from the foregoing description that the preparation mold provided in this embodiment may implement production of the plastic-packaged power module with high reliability, and process development of a power module with pins at different positions may be easily implemented by replacing the replaceable upper mold core of the plastic packaging mold corresponding to the plastic-packaged power module. In this way, development costs are reduced, a mold making period is shortened, and product development efficiency is improved. In addition, if the mold cannot be used due to adhesive overflow caused by abnormal production, the replaceable upper mold core may be replaced to quickly resolve the problem and avoid affecting production.

An embodiment of the present disclosure further provides a device. The device includes a power supply module and the power module according to any one of the foregoing that is connected to the power supply module. The device may be different devices such as a servo motor, a frequency converter, or an inverter. However, regardless of a specific function of the device, the used power module may use a plastic packaging layer to wrap a pin, so that waterproof and moisture-proof effects of the power module are improved, and a protection effect of the power module and performance of the power module are improved. In this way, waterproof and moisture-proof effects of the device may be improved, and safety of the device may be improved.

It is clear that a person skilled in the art can make various modifications and variations to example embodiments of the present disclosure without departing from the scope of this application. This application is intended to cover these modifications and variations of this application provided that they fall within the scope of protection defined by the following claims and their equivalent technologies.

What is claimed is:

1. A power module, comprising:
    a substrate, wherein a component is disposed on the substrate, and the component is electrically connected to the substrate;
    a sealing layer, disposed at an interval from the substrate, wherein the substrate and the sealing layer are separated by a filling space;
    a plastic packaging layer, wherein the filling space between the substrate and the sealing layer is filled with the plastic packaging layer, the component is packaged by the plastic packaging layer, and the plastic packaging layer is prepared by a thermosetting material; and
    pins, wherein the pins penetrate the sealing layer and the plastic packaging layer and are electrically connected to the substrate, the pins are partially exposed on a first surface of the sealing layer, and the first surface of the sealing layer faces away from the plastic packaging layer.

2. The power module according to claim 1, wherein a boss structure in a one-to-one correspondence with each of the pins is disposed on the first surface of the sealing layer, and each of the pins penetrates a corresponding boss structure.

3. The power module according to claim 1, wherein each of the pins has a limiting structure, and a second surface of the sealing layer, the second surface of the sealing layer facing the plastic packaging layer and being pressed against the limiting structure.

4. The power module according to claim 3, wherein the limiting structure is a stepped structure.

5. The power module according to claim 1, wherein the plastic packaging layer is partially extended to outside of the sealing layer, and an extension part of the plastic packaging layer wraps at least a side wall of the sealing layer.

6. The power module according to claim 5, wherein the extension part of the plastic packaging layer wraps side walls of the substrate and the sealing layer.

7. The power module according to claim 2, further comprising a cover plate, wherein the cover plate covers the sealing layer and is in pressed contact with the sealing layer, after penetrating the cover plate, the pin is exposed on a surface of the cover plate, and the surface of the cover plate faces away from the plastic packaging layer.

8. The power module according to claim 7, wherein when the sealing layer has the boss structure, an accommodating groove fitting in with the boss structure is disposed on the cover plate.

9. The power module according to claim 8, wherein the boss structure is in an interference fit with the accommodating groove.

10. The power module according to claim 1, wherein the plastic packaging layer is prepared by an Epoxy Molding Compound (EMC) plastic packaging material.

11. A preparation mold, configured to prepare a power module, wherein the preparation mold comprises a lower mold and an upper mold covered with the lower mold, and the upper mold comprises a holder and an upper mold core connected to the holder in a detachable manner; and
    an avoidance hole for avoiding a pin is disposed on the upper mold core, and when the upper mold covers the lower mold, the upper mold core is in pressed contact with the lower mold, and a space to be filled with a thermosetting material is formed through enclosure;
    the power module comprises:
    a substrate, wherein a component is disposed on the substrate, and the component is electrically connected to the substrate;
    a sealing layer, disposed at an interval from the substrate, wherein the substrate and the sealing layer are separated by a filling space;
    a plastic packaging layer, wherein the filling space between the substrate and the sealing layer is filled with the plastic packaging layer, the component is packaged by the plastic packaging layer, and the plastic packaging layer is prepared by a thermosetting material; and
    pins, wherein the pins penetrate the sealing layer and the plastic packaging layer and are electrically connected to the substrate, the pins are partially exposed on a surface of the sealing layer, and the surface of the sealing layer faces away from the plastic packaging layer.

12. The preparation mold according to claim 11, wherein when the power module comprises a cover plate, a locating column is disposed on the upper mold core, and a locating slot fitting in with the locating column is disposed on the cover plate.

13. A device, comprising a power supply module and a power module that is connected to the power supply module;
    the power module comprises:
    a substrate, wherein a component is disposed on the substrate, and the component is electrically connected to the substrate;
    a sealing layer, disposed at an interval from the substrate, wherein the substrate and the sealing layer are separated by a filling space;
    a plastic packaging layer, wherein the filling space between the substrate and the sealing layer is filled with the plastic packaging layer, the component is packaged by the plastic packaging layer, and the plastic packaging layer is prepared by a thermosetting material; and
    pins, wherein the pins penetrate the sealing layer and the plastic packaging layer and are electrically connected to the substrate, the pins are partially exposed on a surface of the sealing layer, and the surface of the sealing layer faces away from the plastic packaging layer.

* * * * *